United States Patent
Chang et al.

(10) Patent No.: US 10,269,986 B2
(45) Date of Patent: Apr. 23, 2019

(54) ROTATED STI DIODE ON FINFET TECHNOLOGY

(71) Applicant: Taiwan Semiconductor Manufacturing Company, Ltd., Hsin-Chu (TW)

(72) Inventors: Sun-Jay Chang, Hsin-Chu (TW);
Ming-Hsiang Song, Shin-Chu (TW);
Jen-Chou Tseng, Jhudong Township (TW); Wun-Jie Lin, Hsin-Chu (TW);
Bo-Ting Chen, Fengyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 85 days.

(21) Appl. No.: 15/074,065

(22) Filed: Mar. 18, 2016

(65) Prior Publication Data
US 2016/0211169 A1    Jul. 21, 2016

Related U.S. Application Data

(62) Division of application No. 13/789,909, filed on Mar. 8, 2013, now Pat. No. 9,318,621.

(51) Int. Cl.
*H01L 27/02* (2006.01)
*H01L 29/06* (2006.01)
(Continued)

(52) U.S. Cl.
CPC ........ *H01L 29/861* (2013.01); *H01L 21/2253* (2013.01); *H01L 27/0255* (2013.01);
(Continued)

(58) Field of Classification Search
CPC ......... H01L 21/76237; H01L 29/66795; H01L 29/66545; H01L 21/2253; H01L 29/6681;
(Continued)

(56) References Cited

U.S. PATENT DOCUMENTS 6,835,967 B2   12/2004   Yeo et al.
7,173,310 B2    2/2007   Voldman et al.
(Continued)

FOREIGN PATENT DOCUMENTS

CN   102217074   10/2011
TW   200419768   10/2004

OTHER PUBLICATIONS

Zegnbroeck, Bart J., "2.9 Mobility—Resistivity—Sheet Resistance", https://ecee.colorado.edu/~bart/book/mobility.htm, 1997.*

*Primary Examiner* — Yu Chen
*Assistant Examiner* — Vincent Wall
(74) *Attorney, Agent, or Firm* — Slater Matsil, LLP

(57) ABSTRACT

A diode includes a first plurality of combo fins having lengthwise directions parallel to a first direction, wherein the first plurality of combo fins comprises portions of a first conductivity type. The diodes further includes a second plurality of combo fins having lengthwise directions parallel to the first direction, wherein the second plurality of combo fins includes portions of a second conductivity type opposite the first conductivity type. An isolation region is located between the first plurality of combo fins and the second plurality of combo fins. The first and the second plurality of combo fins form a cathode and an anode of the diode. The diode is configured to have a current flowing in a second direction perpendicular to the first direction, with the current flowing between the anode and the cathode.

21 Claims, 16 Drawing Sheets

(51) Int. Cl.
    *H01L 29/66*     (2006.01)
    *H01L 29/78*     (2006.01)
    *H01L 21/225*     (2006.01)
    *H01L 29/861*     (2006.01)
    *H01L 29/868*     (2006.01)

(52) U.S. Cl.
    CPC ...... *H01L 29/0692* (2013.01); *H01L 29/6609* (2013.01); *H01L 29/6681* (2013.01); *H01L 29/66795* (2013.01); *H01L 29/785* (2013.01); *H01L 29/868* (2013.01)

(58) Field of Classification Search
    CPC ............. H01L 29/0692; H01L 27/0255; H01L 29/6609; H01L 29/861; H01L 27/0886; H01L 27/0924; H01L 29/785; H01L 29/1037; H01L 29/66136; H01L 29/868; H01L 21/82431; H01L 21/823821
    See application file for complete search history.

(56) References Cited

U.S. PATENT DOCUMENTS

| | | | |
|---|---|---|---|
| 7,180,134 B2 * | 2/2007 | Yang | H01L 21/84 257/331 |
| 7,402,496 B2 * | 7/2008 | Liu | H01L 21/823807 257/66 |
| 7,964,893 B2 * | 6/2011 | Lee | H01L 21/82343 257/173 |
| 2002/0079556 A1 * | 6/2002 | Ishikura | H01L 21/761 257/607 |
| 2008/0263492 A1 * | 10/2008 | Chuang | H01L 21/76895 716/122 |
| 2009/0041406 A1 | 2/2009 | Schulz | |
| 2011/0169101 A1 | 7/2011 | Doornbos et al. | |
| 2013/0122676 A1 * | 5/2013 | Jeng | H01L 21/82343 438/306 |
| 2013/0168732 A1 | 7/2013 | Lin et al. | |
| 2013/0328162 A1 | 12/2013 | Hu et al. | |
| 2014/0131765 A1 * | 5/2014 | Tsai | H01L 27/0255 257/133 |
| 2014/0131831 A1 * | 5/2014 | Wei | H01L 21/77 257/506 |
| 2014/0151809 A1 * | 6/2014 | Lin | H01L 27/0255 257/355 |
| 2014/0183641 A1 * | 7/2014 | Fan | H01L 29/66136 257/365 |

\* cited by examiner

ROTATED STI DIODE ON FINFET TECHNOLOGY

PRIORITY CLAIM AND CROSS-REFERENCE

This application is a divisional of U.S. patent application Ser. No. 13/789,909, entitled "Rotated STI Diode on FinFET Technology," filed on Mar. 8, 2013, which application is incorporated herein by reference.

BACKGROUND

It is well known that extremely high voltages can develop in the vicinity of an integrated circuit due to the build-up of static charges. A high electrical potential may be generated to an input or output buffer of an integrated circuit, which may be caused by a person touching a package pin that is electrically connected to the input or output buffer. When the electrostatic charges are discharged, a high current is produced at the input and output nodes of the integrated circuit. Electro-Static Discharge (ESD) is a serious problem for semiconductor devices since it has the potential of destroying the entire integrated circuit.

The duration of the ESD transient is very short, typically in the order of nanoseconds, and the conventional circuit breakers cannot react quickly enough to provide adequate protection. For this reason, it has become a known practice to incorporate ESD devices in integrated circuits. When an ESD transient occurs, the ESD devices are turned on to conduct the ESD current to electrical ground, and hence the integrated circuits connected to the ESD devices are protected.

There is a plurality of types of ESD devices. Among the commonly used ESD devices are Shallow Trench Isolation (STI) diodes. STI diodes are applicable solutions for overdrive applications, in which the maximum endurable voltages of gate dielectrics of FinFET may be lower than the power supply voltages. The chip area consumed by STI diodes, however, is relatively high.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Shallow Trench Isolation (STI) diode and the method of forming the same are provided in accordance with various exemplary embodiments. The intermediate stages of forming the STI diode are illustrated. The variations and the operation of the STI diodes are discussed. Throughout the various views and illustrative embodiments, like reference numbers are used to designate like elements.

Figure 1:
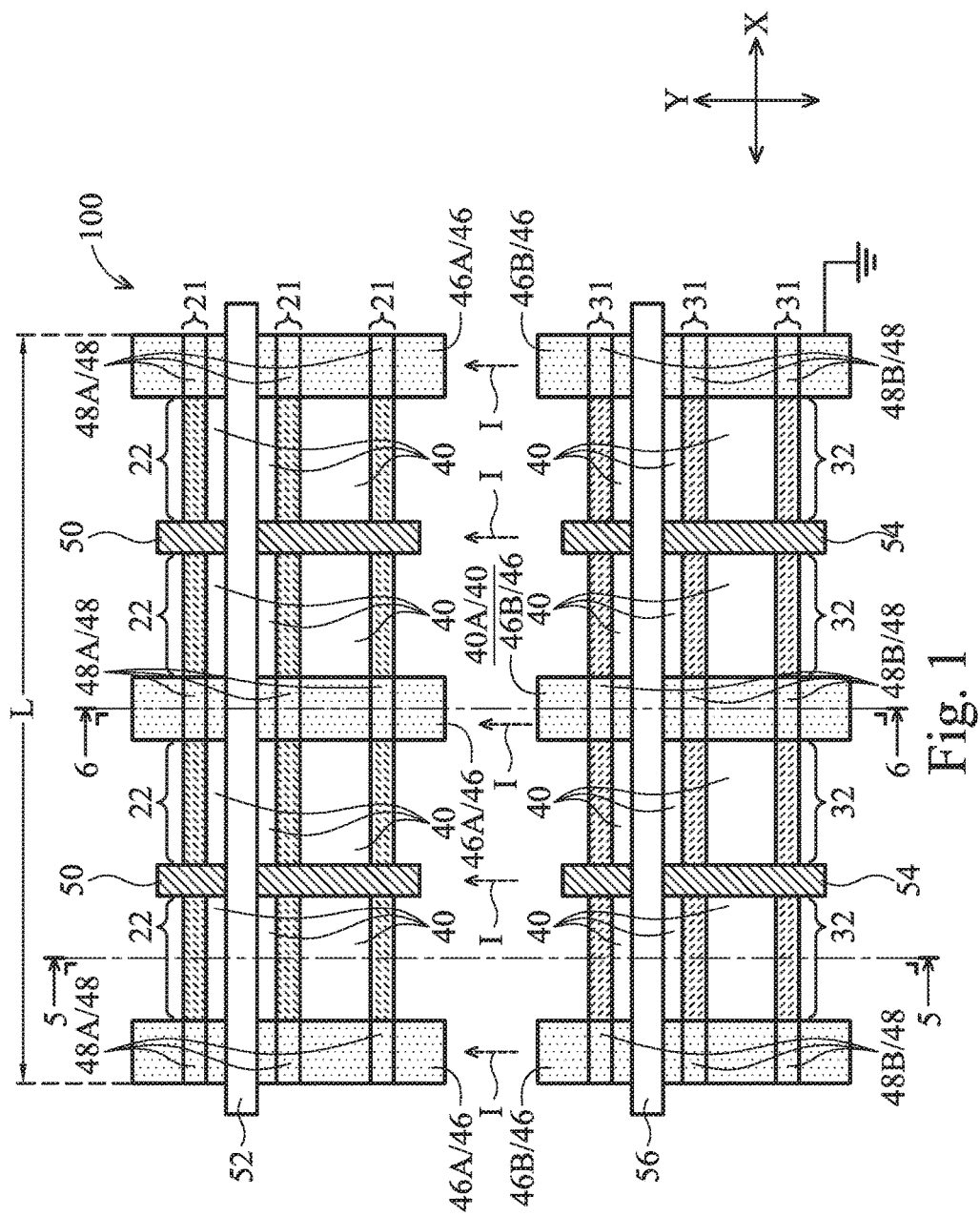
FIG. 1 illustrates a top view of a Shallow Trench Isolation (STI) diode in accordance with some exemplary embodiments, wherein dummy gates are used to define epitaxy regions.
Figure 5:
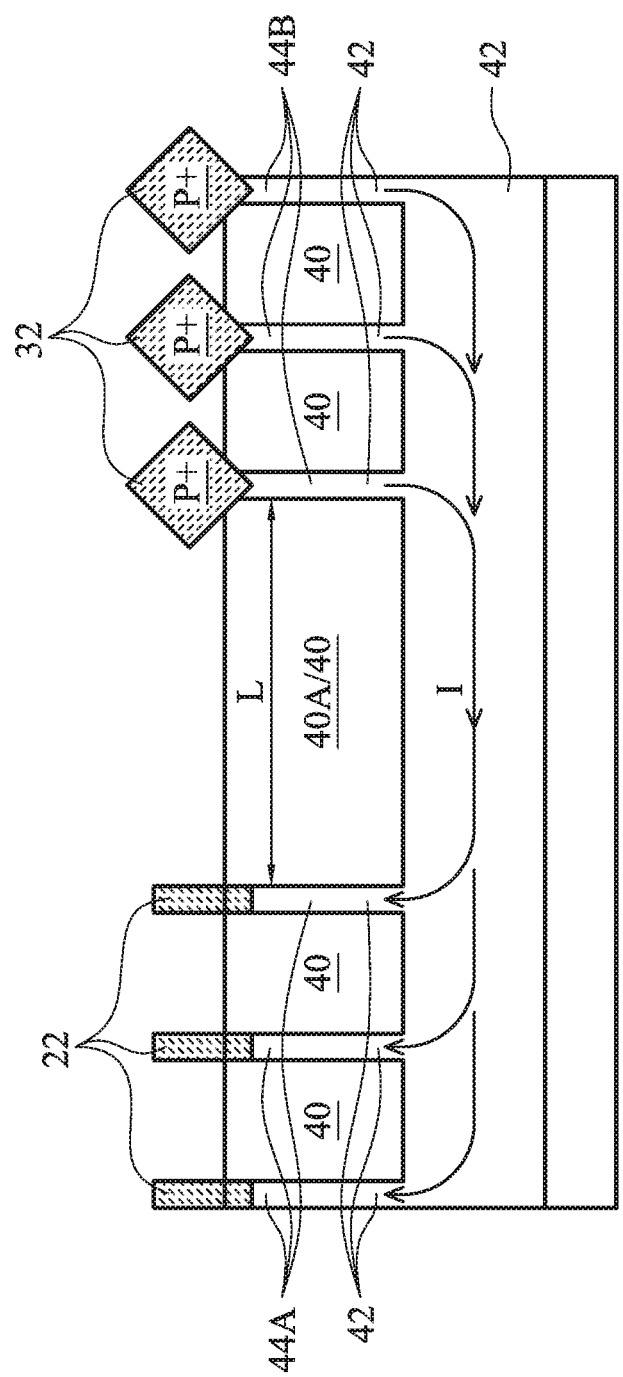
FIGS. 5 and 6 are cross-sectional views of the STI diode in FIG. 1.

FIG. 1 illustrates a top view of STI diode 100 in accordance with some exemplary embodiments. STI diode 100 may be used for Electro-Static Discharge (ESD) protection, and hence the current Ion when diode 100 is operated is high. Diode 100 includes combo semiconductor fins 21 and 31 separated from each other by STI regions 40. FIG. 5 illustrates a cross-sectional view of diode 100, wherein the cross-sectional view is obtained from the plane crossing line 5-5 in FIG. 1. As shown in FIGS. 1 and 5, combo semiconductor fins 21 (FIG. 1) include a plurality of n-type semiconductor fins 22 (FIG. 5), which may have an n-type impurity concentration higher than about $10^{19}/cm^3$, or between about $10^{19}/cm^3$ and about $10^{21}/cm^3$. Accordingly, semiconductor fins 22 are also referred to as n+ fins 22. Referring back to FIG. 1, combo semiconductor fins 21 further include fins 48A connected to, and in contact with, fins 22. Combo semiconductor fins 31 includes a plurality of p-type semiconductor fins 32 (also refer to FIG. 5), which may have a p-type impurity concentration higher than about $10^{19}/cm^3$, or between about $10^{19}/cm^3$ and about $10^{21}/cm^3$. Accordingly, semiconductor fins 32 are also referred to as p+ fins 32. As shown in FIG. 1, combo semiconductor fins 31 further include fins 48B connected to, and in contact with, fins 32.

Referring to FIG. 5, p-well region 42 is underlying and connected to semiconductor fins 22 and 32. Accordingly, p-well region 42 forms a p-n junction (hence diode 100) with n+ fins 22, and p+ fins 32 may act as the pick-up regions of p-well region 42. N+ fins 22 act as the cathode of STI diode 100, and p+ fins 32 and p-well region 42 in combination form the anode of STI diode 100. Furthermore, p-well region 42 comprises a plurality of semiconductor strips 44, each aligned to, and connected to, one of n+ fins 22 and p+ fins 32. Each of semiconductor strips 44 is between two of STI regions 40. N+ fins 22 and p+ fins 32 (and combo fins 21 and 31 in FIG. 1) are spaced apart from each other by a large STI region 40, which is also denoted as 40A. In some embodiments, length L' of STI region 40A is between about 134 nm and about 806 nm. It is appreciated that although the illustrated exemplary STI diode 100 adopts p-well region 42, p-well region 42 may be replaced by an n-well region in alternative embodiments.

Referring back to FIG. 1, a plurality of dummy gates 46 (including 46A and 46B) are formed over portions of semiconductor fins 48, wherein n+ fins 22 and p+ fins 32 are formed between, and defined by, neighboring dummy gates 46. In accordance with some embodiments, different from functional gates, dummy gates 46 are not used to control the current flowing between the fin portions on opposite ends of dummy gates 46. Dummy gates 46 may be electrically floating, or may be grounded or at any bias. N+ fins 22 and p+ fins 32 may be formed using epitaxy, and dummy gates 46 help relieve the pattern loading effect in the epitaxy of n+ fins 22 and p+ fins 32. Contact plugs 50 are formed to electrically connect to n+ fins 22. Contact plug 52 is formed to interconnect contact plugs 50. Accordingly, all n+ fins 22 are electrically interconnected to form the cathode of STI diode 100. Contact plugs 54 are formed to electrically connect to p+ fins 32. Contact plug 56 is formed to interconnect contact plugs 54. Accordingly, all p+ fins 32 are electrically interconnected to form the cathode of STI diode 100.

As shown in FIG. 1, the lengthwise direction of combo fins 21 and 31 are parallel to the X direction, the likely conducting current I of STI diode 100 is in the Y direction, which is perpendicular to the X direction. In some embodiments, when STI diode 100 is turned on to conduct current I, for example, when an ESD event occurs, and STI diode 100 is operated under the forward mode, current I flows from p+ fins 32 through the underlying semiconductor strips 44A (FIG. 5), the portion of p-well 42 under STI region 40A, semiconductor strips 44B, and to n+ fins 22. Accordingly, STI Diode 100 is referred to as a rotated STI diode since the lengthwise direction of combo fins 21 and 31 is perpendicular to the direction of current I. As shown in FIG. 1, the width of current I is essentially equal to length L of combo fins 21 and 31. Therefore, the width of current I has a great value, and the current conducting ability of STI diode 100 is higher than the conducting ability of conventional STI diodes, whose lengthwise direction of active regions are parallel to the respective current flowing directions.

Figure 2:
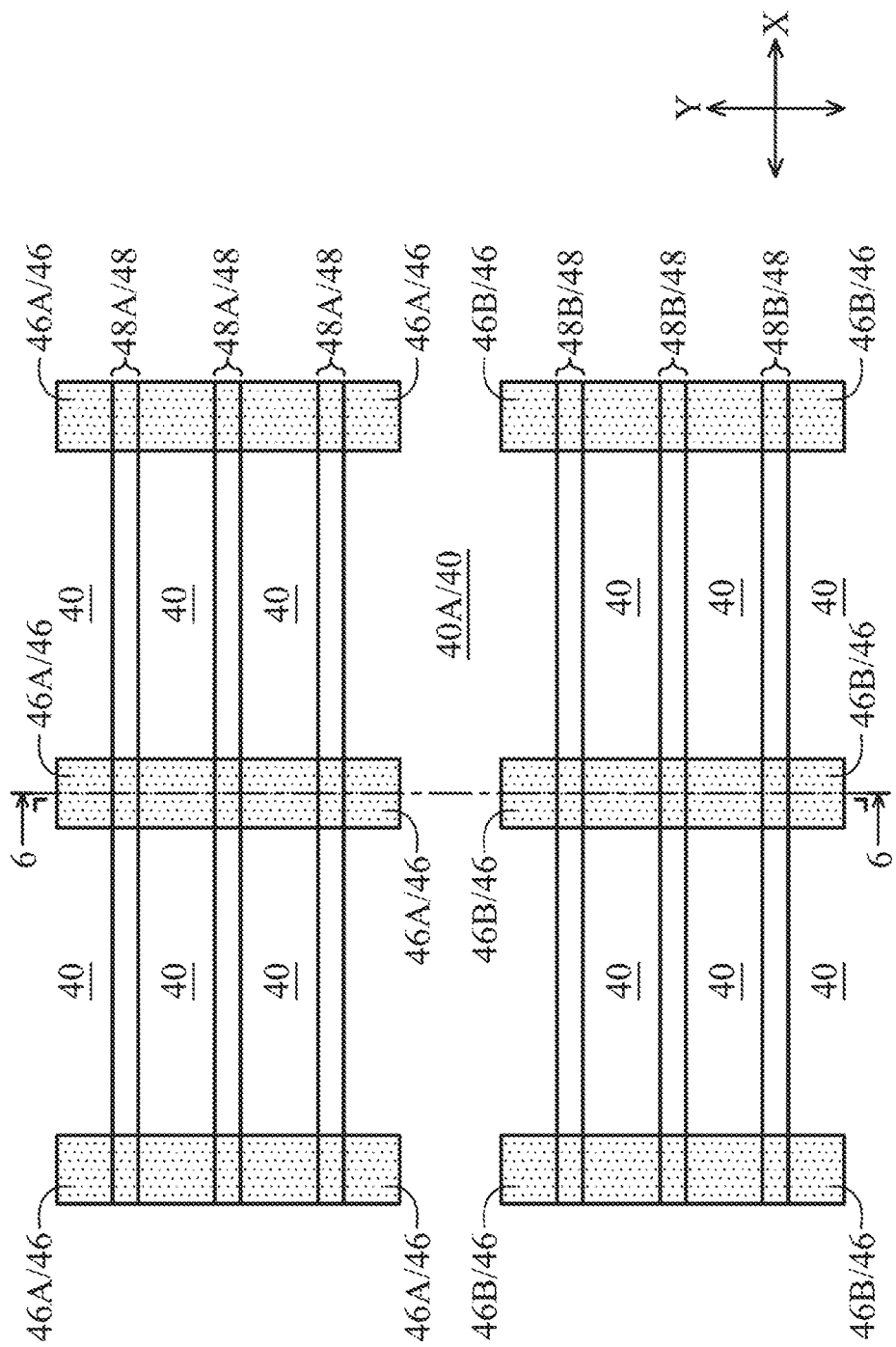
FIGS. 2 through 4 are top views of intermediate stages in the manufacturing of the STI diode in FIG. 1 in accordance with some exemplary embodiments.
Figure 3:
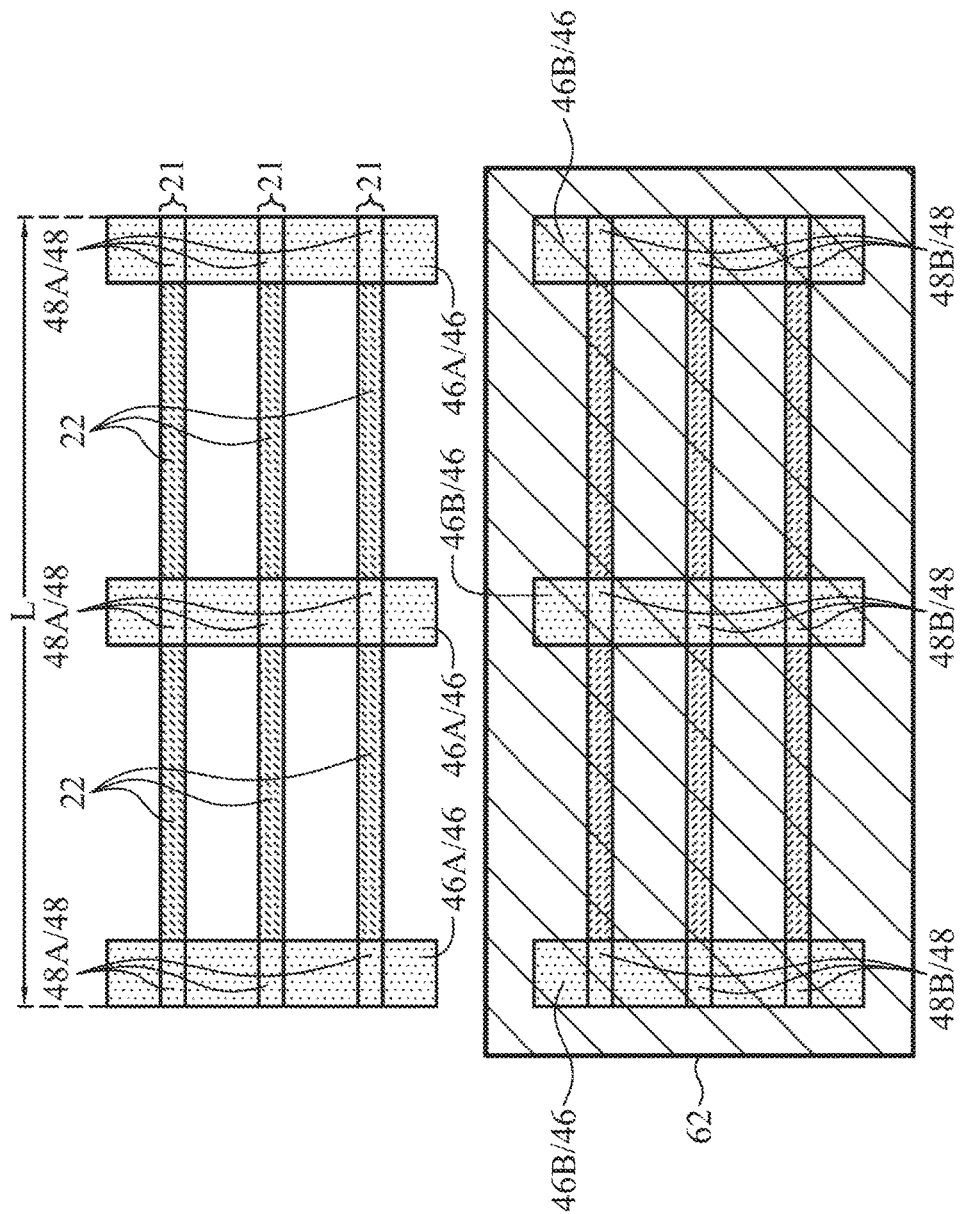
Figure 4:
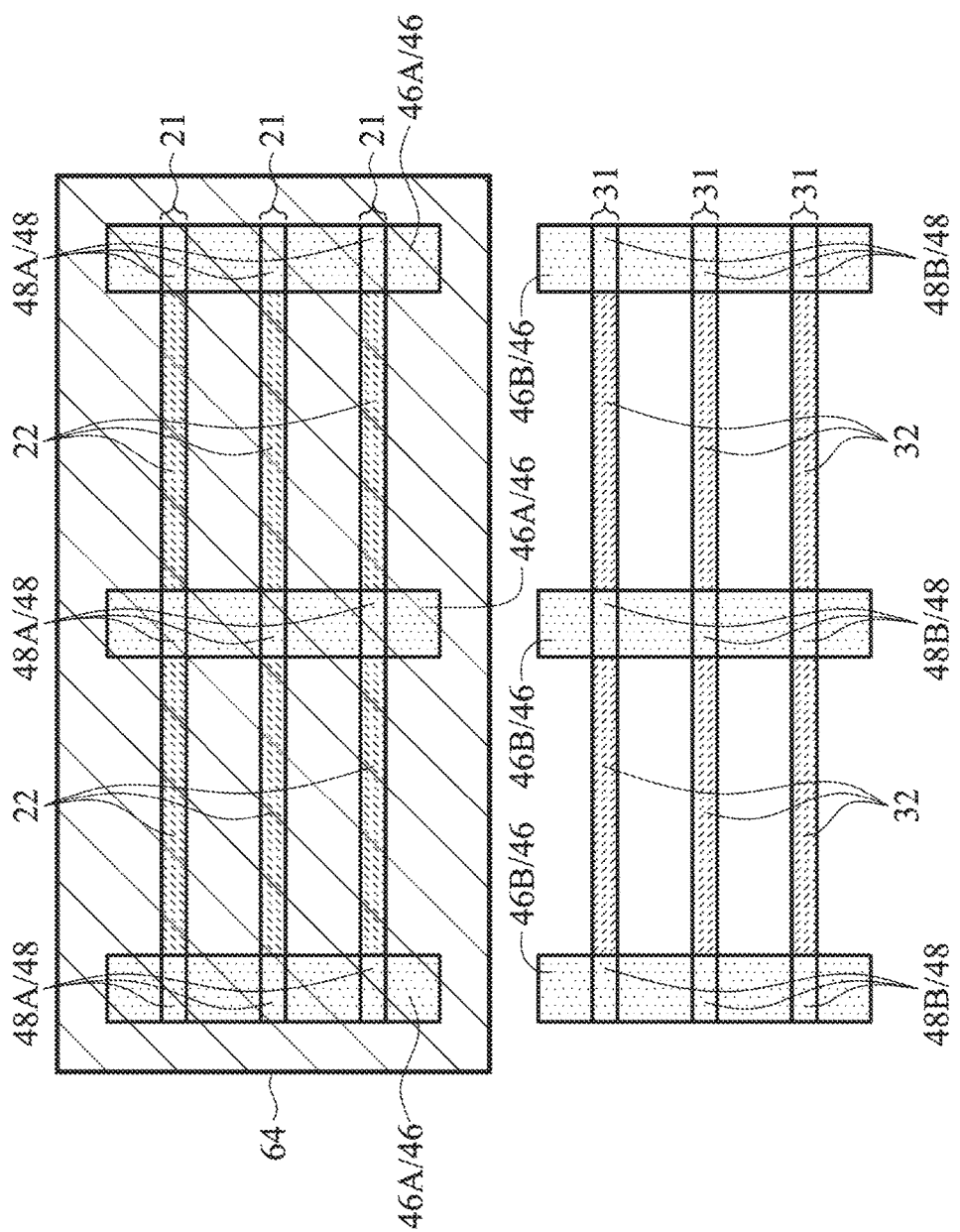
Figure 6:
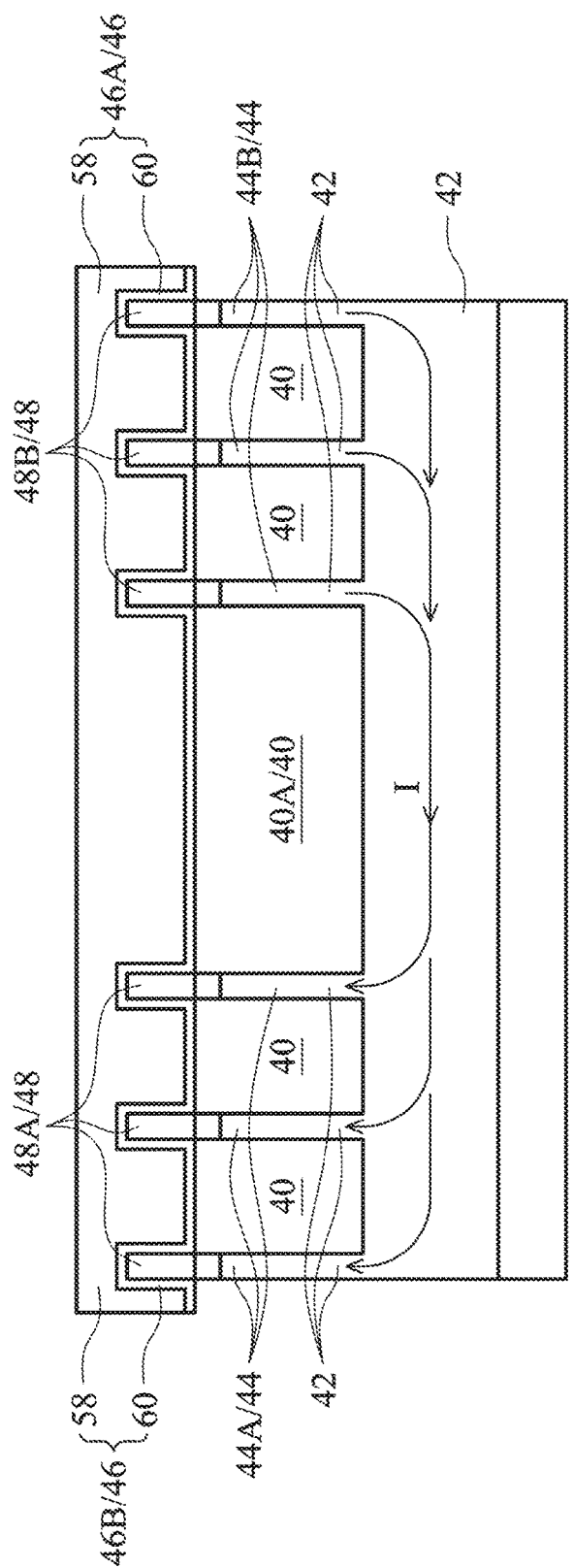

FIGS. 2 through 4 illustrate a brief process for forming the structure in FIG. 1. Referring to FIG. 2, semiconductor fins 48, which are higher than the top surface of STI regions 40, are formed first. Semiconductor fins 48 include fins 48A parallel to each other, and fins 48B parallel to each other, and parallel to fins 48A. The cross-sectional view of fins 48 may be found in FIG. 6, wherein the cross-sectional view is obtained from the plane crossing lines 6-6 in FIGS. 1 and 2. As shown in FIG. 6, p-well region 42 may extend into semiconductor strips 44A and 44B, semiconductor fins 48A and 48B, and under STI region 40A. Hence, semiconductor fins 48A and 48B may be moderately doped with the p-type impurities, for example, with a p-type impurity concentration between about $10^{14}/cm^3$ and about $10^{18}/cm^3$. Fins 48A are aligned to the underlying semiconductor strips 44A. Fins 48B are aligned to the underlying semiconductor strips 44B.

Referring back to FIG. 2, semiconductor fins 48 have lengthwise directions parallel to the X direction. A plurality of dummy gates 46 are formed on the sidewalls and the top surfaces of semiconductor fins 48. Dummy gates 46 (including 46A and 46B) may have lengthwise directions in the Y direction. Dummy gates 46A may be disconnected from dummy gates 46B. Furthermore, fins 48A may be aligned to fins 48B in the Y direction, and dummy gates 46A may be aligned to dummy gates 46B, with each of dummy gates 46A aligned to one of dummy gates 46B, and with both aligned to a straight line. Some of dummy gates 46A may be aligned to, and cover, the edges of fins 48A, and some of dummy gate electrode(s) 46A may cross, and cover, the intermediate portions (such as the middle portions) of fins 48A. Some of dummy gates 46B may be aligned to the edges of fins 48B, and some of dummy gate electrode(s) 46B may cross over the intermediate portions (such as the middle portions) of fins 48B.

A cross-sectional view of dummy gates 46 is shown in FIG. 6, wherein the cross-sectional view is obtained from the plane crossing lines 6-6 in FIGS. 1 and 2. Dummy gates 46 may include dummy gate electrodes 58, and dummy gate dielectrics 60 underlying dummy gate electrodes 58. Dummy gate dielectrics 60 are formed on the sidewalls and the top surfaces of semiconductor fins 48.

Next, a mask is formed to cover fins 48B and dummy gates 46B, while fins 48A are left not covered. FIG. 3 illustrates the respective mask 62. Mask 62 may be a hard mask, and may comprise silicon nitride, for example. The portions of fins 48A shown in FIG. 2, which portions are not covered by dummy gates 46A, may be etched, and an epitaxy may be performed to regrow semiconductor fins 22 where fins 48A were etched. Fins 22 may comprise silicon, silicon carbon, or the like, and may be heavily doped with an n-type impurity (such as phosphorus and/or arsenic) during the epitaxy. In alternative embodiments, fins 22 may be implanted with the n-type impurity after the epitaxy. The portions of fins 48A under dummy gates 46A are not etched, and may be used as the seeds for growing semiconductor fins 22. Fins 22 and the remaining portions of fins 48A form combo fins 21. After the re-growth of fins 22, mask 62 is removed.

Next, a mask is formed to cover fins 22 and dummy gates 46A, while fins 48B and dummy gates 46B are left not covered. FIG. 4 illustrates the respective mask 64. Mask 64 may be a hard mask, and may comprise silicon nitride, for example. The portions of fins 48B in FIG. 3, which portions are not covered by dummy gates 46B, may be etched, and an epitaxy is performed to regrow semiconductor fins 32 where fins 48B were etched. Fins 32 may comprise silicon germanium, and may be heavily doped with a p-type impurity (such as boron and/or indium) during the epitaxy. In alternative embodiments, fins 32 are implanted after the epitaxy. The portions of fins 48B under dummy gates 46B are not etched, and may be used as the seeds for growing semiconductor fins 32. Fins 32 and the remaining portions of fins 48B form combo fins 31. After the re-growth of fins 32, mask 64 is removed.

Next, as shown in FIG. 1, contact plugs 50, 52, 54 and 56 are formed to connect to fins 22 and 32. Silicide regions (not shown) may be formed on the top surfaces of fins 22 and 32. Contact plug 52 and 56 are used as the connections of the cathode and the anode, respectively, of STI diode 100.

Figure 7:
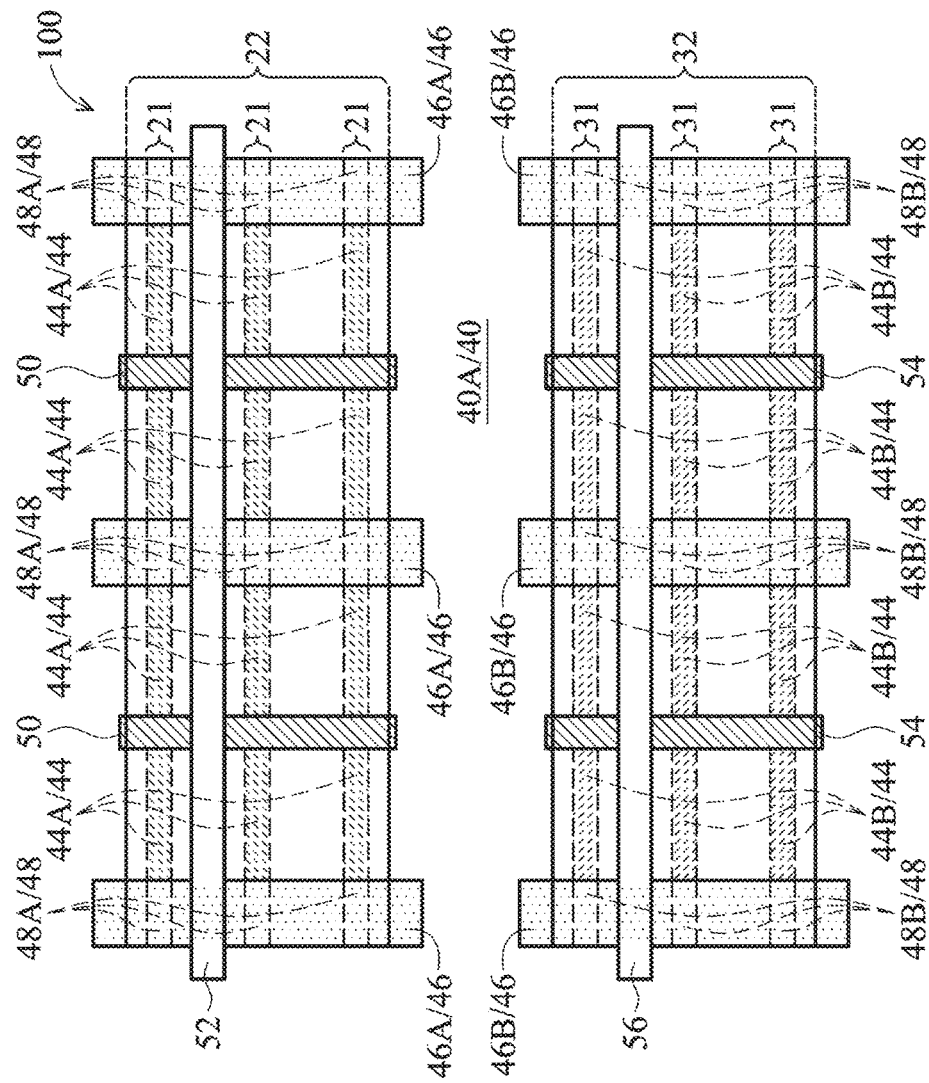
FIG. 7 illustrates an STI diode, whose fins are merged.

In STI diode 100 shown in FIG. 1, fins 22 and 32 are separate and parallel fins. In alternative embodiments, as shown in FIG. 7, fins 22 may be merged after epitaxy, and fins 32 may be merged after epitaxy. Semiconductor strips 44A and 44B are shown using dashed lines to indicate the original positions of the etched portions of fins 48A and 48B, respectively. The formation of STI diode 100 in FIG. 7 is essentially the same as the formation of diode 100 in FIG. 1, as shown in FIGS. 2 through 4, except the volumes of fins 22 and 32 in FIG. 7 are greater than in FIG. 1.

FIGS. 8 through 14 illustrate the final structures and the formation of various STI diodes 100 in accordance with alternative embodiments. Unless specified otherwise, the materials and formation methods of the components in these embodiments are essentially the same as the like components, which are denoted by like reference numerals in the embodiments shown in FIGS. 1 through 7. The details regarding the formation process and the materials of the components shown in FIGS. 8 through 14 may thus be found in the discussion of the embodiments shown in FIGS. 1 through 7.

Figure 8:
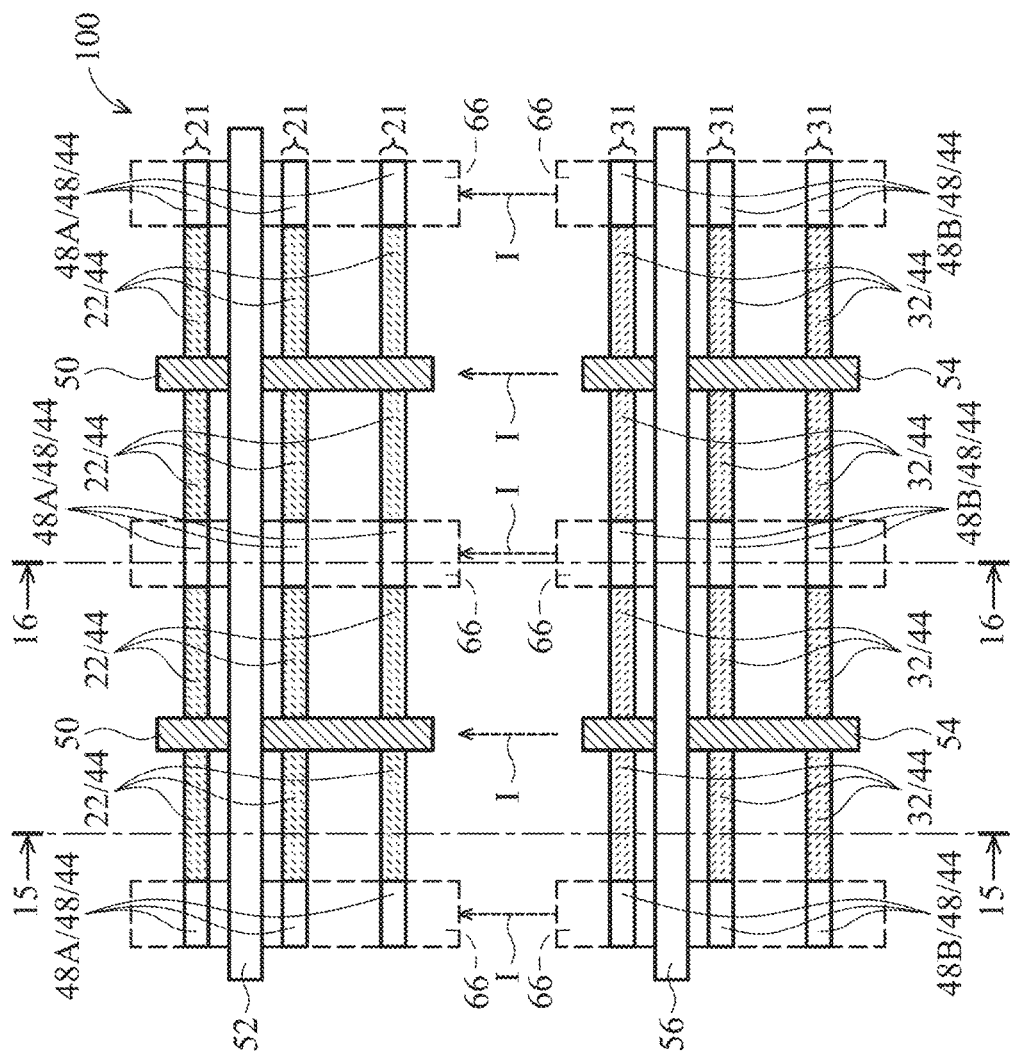
FIG. 8 illustrates a top view of an STI diode in accordance with alternative embodiments, wherein epitaxy block regions are used to define epitaxy regions.

Referring to FIG. 8, in accordance with some embodiments, STI diode 100 includes fins 22 connected to fins 48A to form combo fins 21, and fins 32 connected to fins 48B to form combo fins 31. Combo fins 21 and 31 are aligned to the underlying semiconductor strips 44 (also see FIGS. 5 and 6 for reference). No dummy gate electrodes are formed over fins 48, however, and dielectric layers (not shown) such as a Contact Etch Stop Layer (CESL) and an Inter-Layer Dielectric (ILD) will be formed on the sidewalls and top surfaces of fins 48, with the CESL contacting fins 48 in some embodiments. Contact plugs 50 and 52 are formed in the ILD to interconnect fins 22, and contact plugs 54 and 56 are formed in the ILD to interconnect fins 32. STI diode 100 in these embodiments is also a rotated STI diode since the direction of current I of diode 100 is perpendicular to the lengthwise directions of combo fins 21 and 31.

In FIG. 8, epitaxy block regions 66 are illustrated. The relative positions of epitaxy block regions 66 (with relative to combo fins 21 and 31) may be essentially the same as the locations of dummy gate electrodes 46 in FIG. 1. Epitaxy block regions 66 are the regions that are blocked during both the epitaxial re-growth of fins 22 and the epitaxial re-growth of fins 32, hence are the regions in which the original fins 48 remain. FIGS. 9 through 12 schematically illustrate a process for forming STI diode 100 in FIG. 8.

Figure 9:
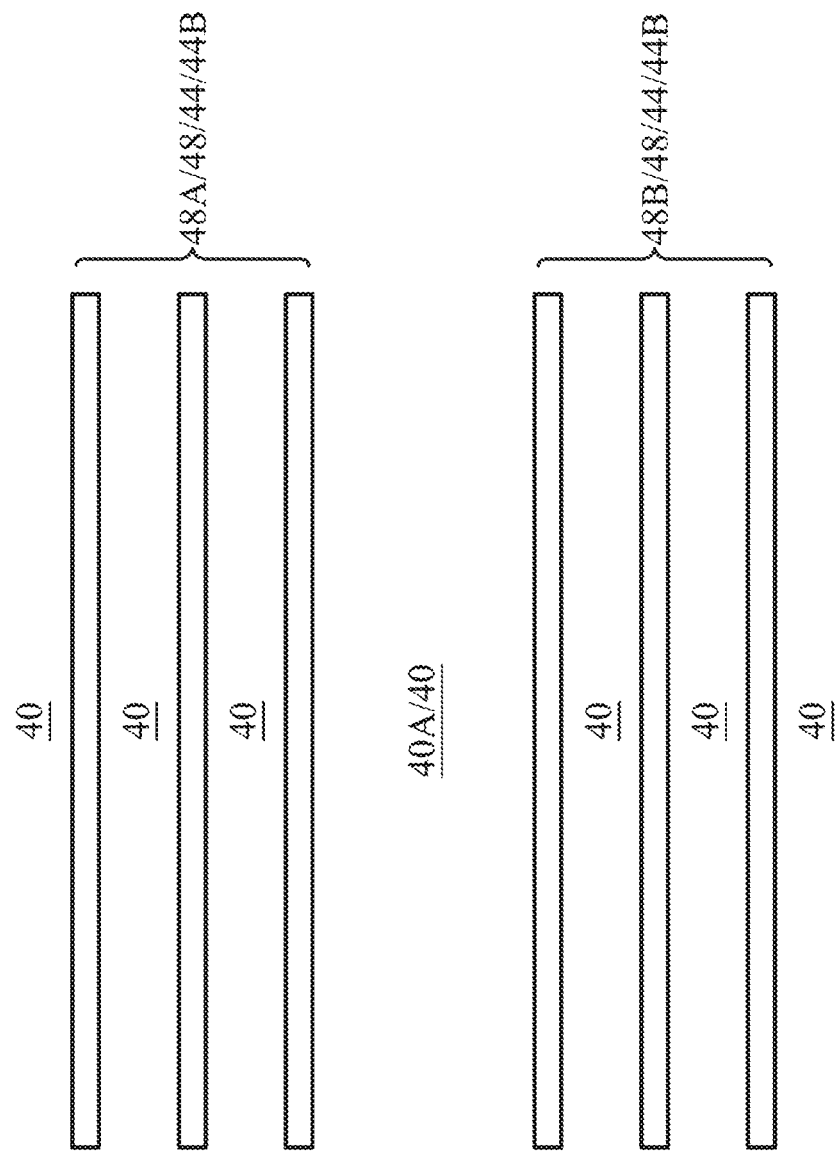
FIGS. 9 through 12 are top views of intermediate stages in the manufacturing of the STI diode in FIG. 8 in accordance with some exemplary embodiments.

Referring to FIG. 9, which is a top view, fins 48A are formed to align to underlying semiconductor strips 44A. Fins 48B are formed to align to underlying semiconductor strips 44B. Fins 48A and 48B are parallel to each other. Fins 48A and 48B are above the top surfaces of STI regions 40. Fins 48A and 48B may have a same doping concentration as the underlying well region (not shown), which may be essentially the same as p-well 42 in FIG. 6. In some exemplary embodiments, fins 48A and 48B and the underlying well region are moderately doped, for example, to a p-type impurity concentration between about $10^{14}/cm^3$ and about $10^{18}/cm^3$. Throughout the description, the regions moderately doped with a p-type impurity are referred to as moderately doped p-type regions. Hence, fins 48A and 48B are moderately doped p-type fins.

Figure 10:
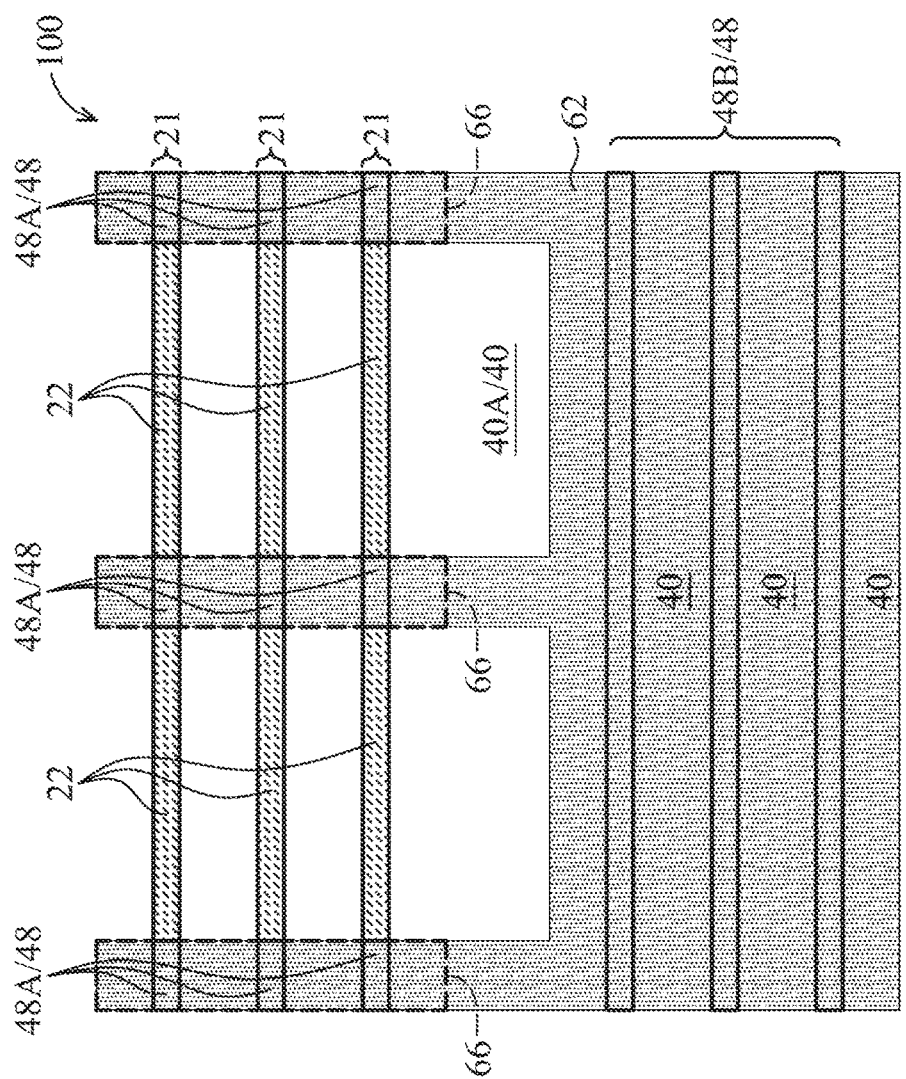

Referring to FIG. 10, mask 62 is formed. Mask 62 may be a hard mask comprising silicon nitride, for example, although other materials that can sustain the high temperature of epitaxy may also be used. Mask 62 covers fins 48B and some portions of fins 48A, wherein the masked portions of fins 48A correspond to epitaxy block regions 66. The exposed portions of fins 48A are then etched, and fins 22 are re-grown in an epitaxy step. Fins 22 may be in-situ heavily doped with an n-type impurity (such as phosphorus and/or arsenic) during the epitaxy, or may be implanted after the epitaxy.

Figure 15:
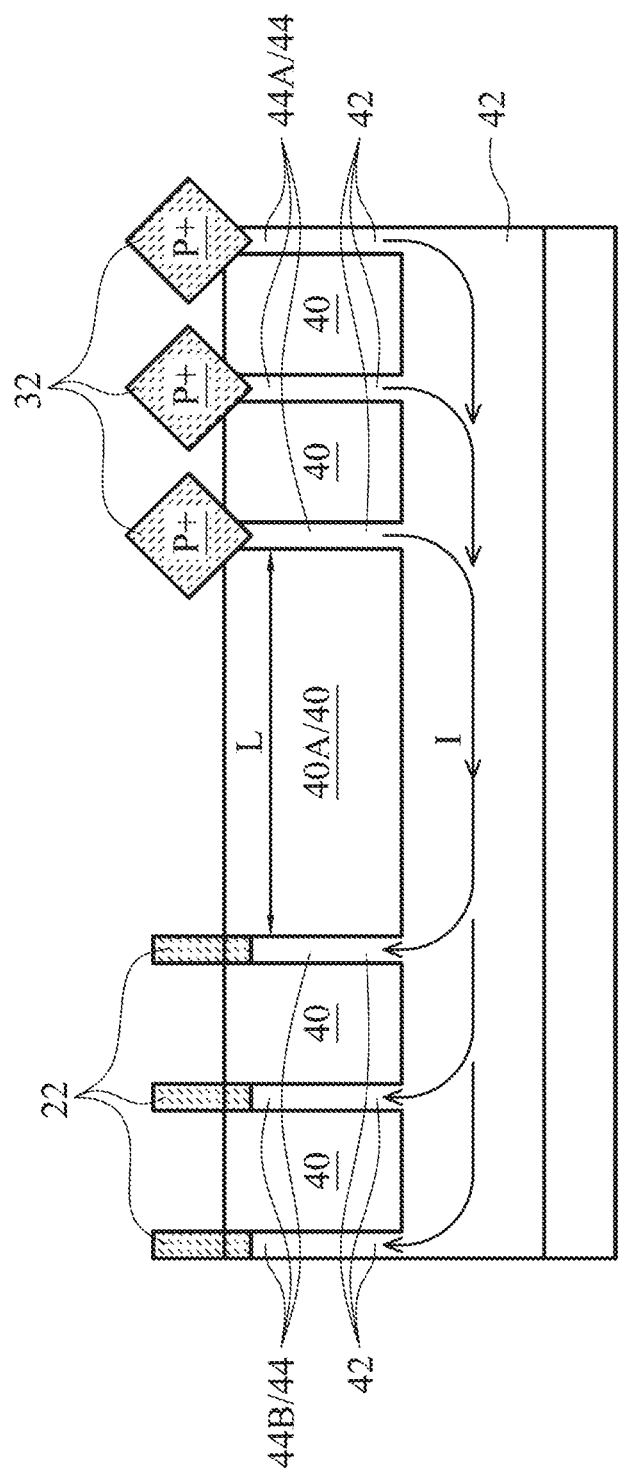
FIGS. 15 and 16 illustrate cross-sectional views of the structure shown in FIG. 8 in accordance with some embodiments.
Figure 16:
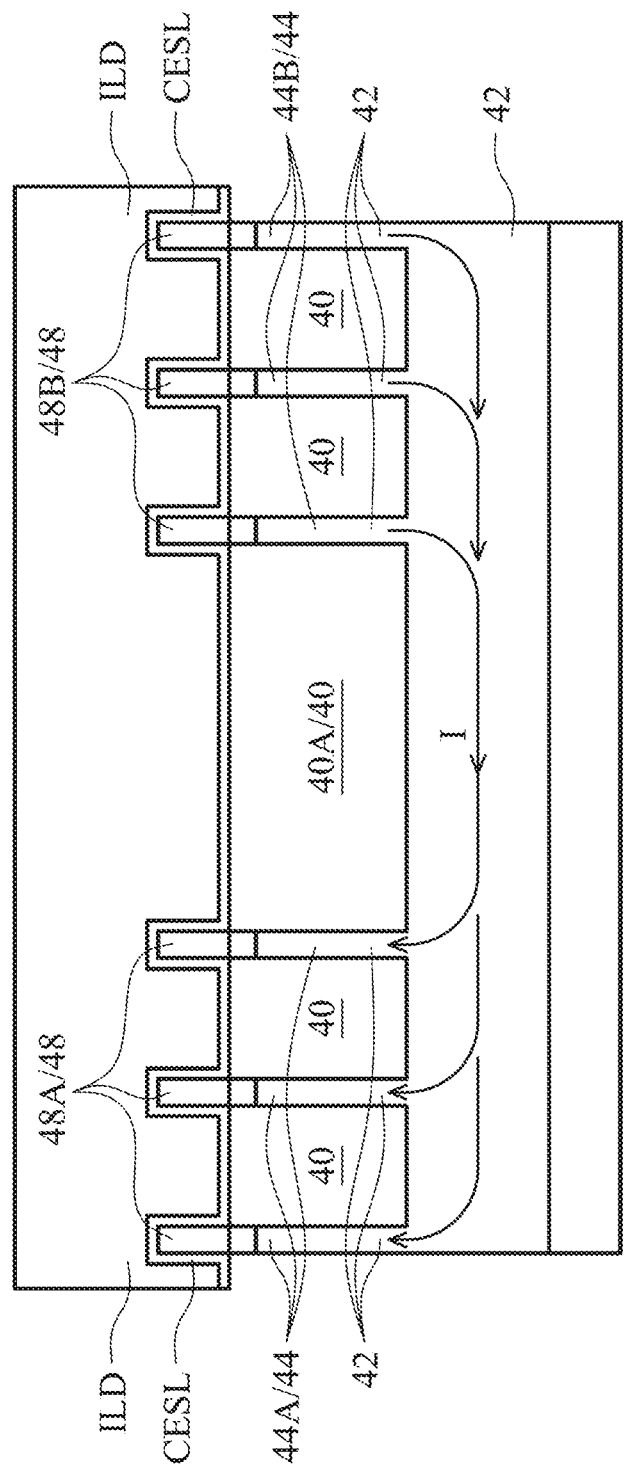

FIGS. 15 and 16 illustrate cross-sectional views of the structure shown in FIG. 8. The cross-sectional view shown in FIG. 15 is obtained from the plane containing line 15-15 in FIG. 8. The cross-sectional view shown in FIG. 16 is obtained from the plane containing line 16-16 in FIG. 8.

Figure 11:
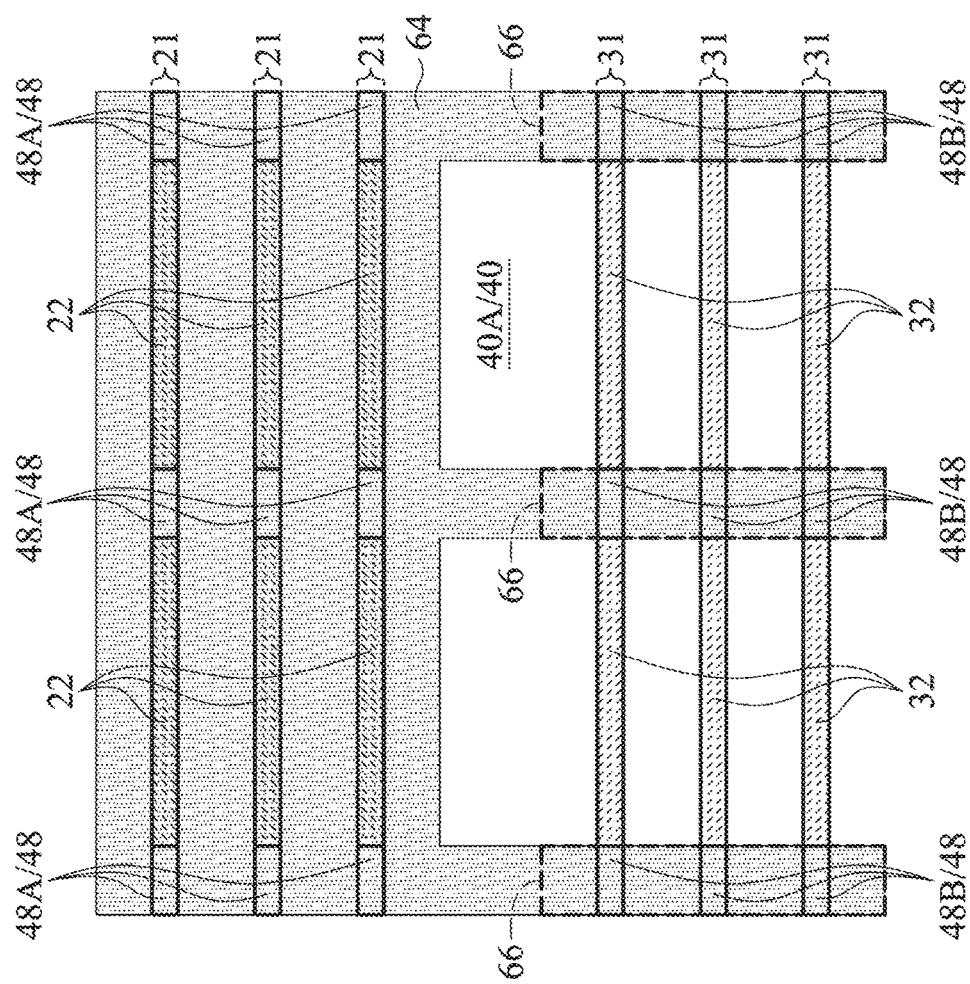
Figure 12:
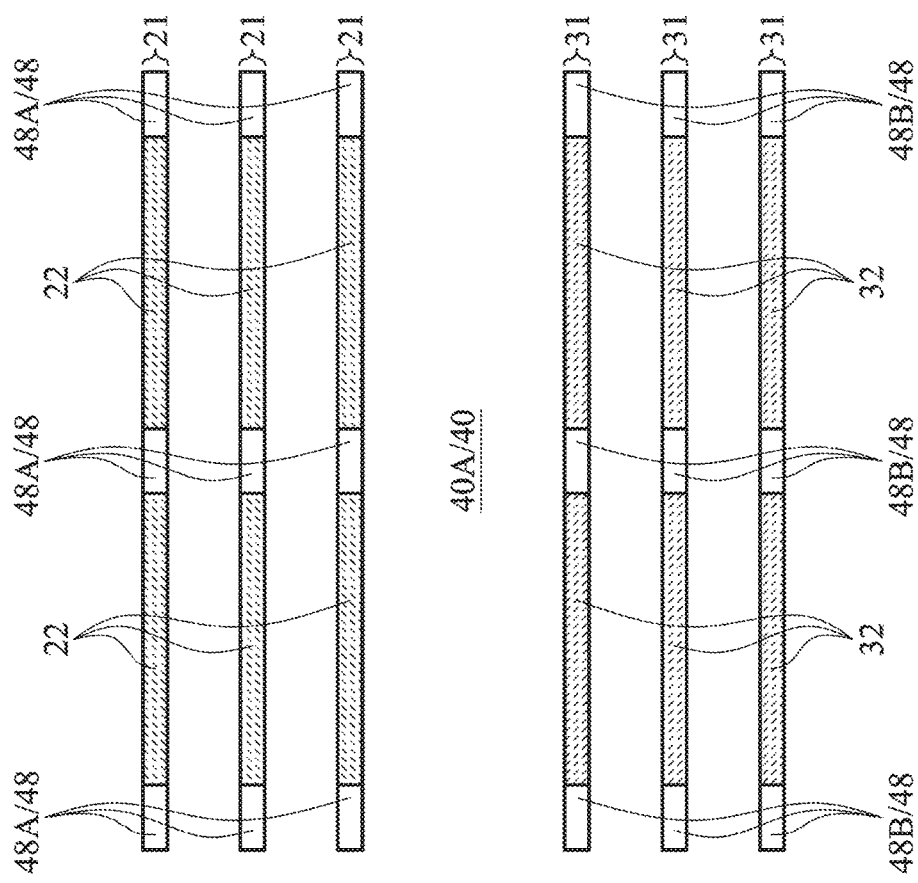

Next, mask 62 is removed, and mask 64 is formed, as shown in FIG. 11. Mask 64 may also be a hard mask comprising silicon nitride, for example, although other materials may also be used. Mask 64 covers fins 48A and 22 and some portions of fins 48B, wherein the masked portions of fins 48B correspond to epitaxy block regions 66. The exposed portions of fins 48B are then etched, and fins 32 are re-grown in an epitaxy step. Fins 32 may be heavily doped with a p-type impurity (such as boron and/or indium) during the epitaxy, or may be implanted after the epitaxy. After the re-growth of fins 32, mask 64 is removed. The resulting structure is shown in FIG. 12. A CESL (not shown), an ILD (not shown), and contact plugs 50, 52, 54, and 56 may then be formed, and the resulting STI diode 100 is shown in FIG. 8.

Figure 13:
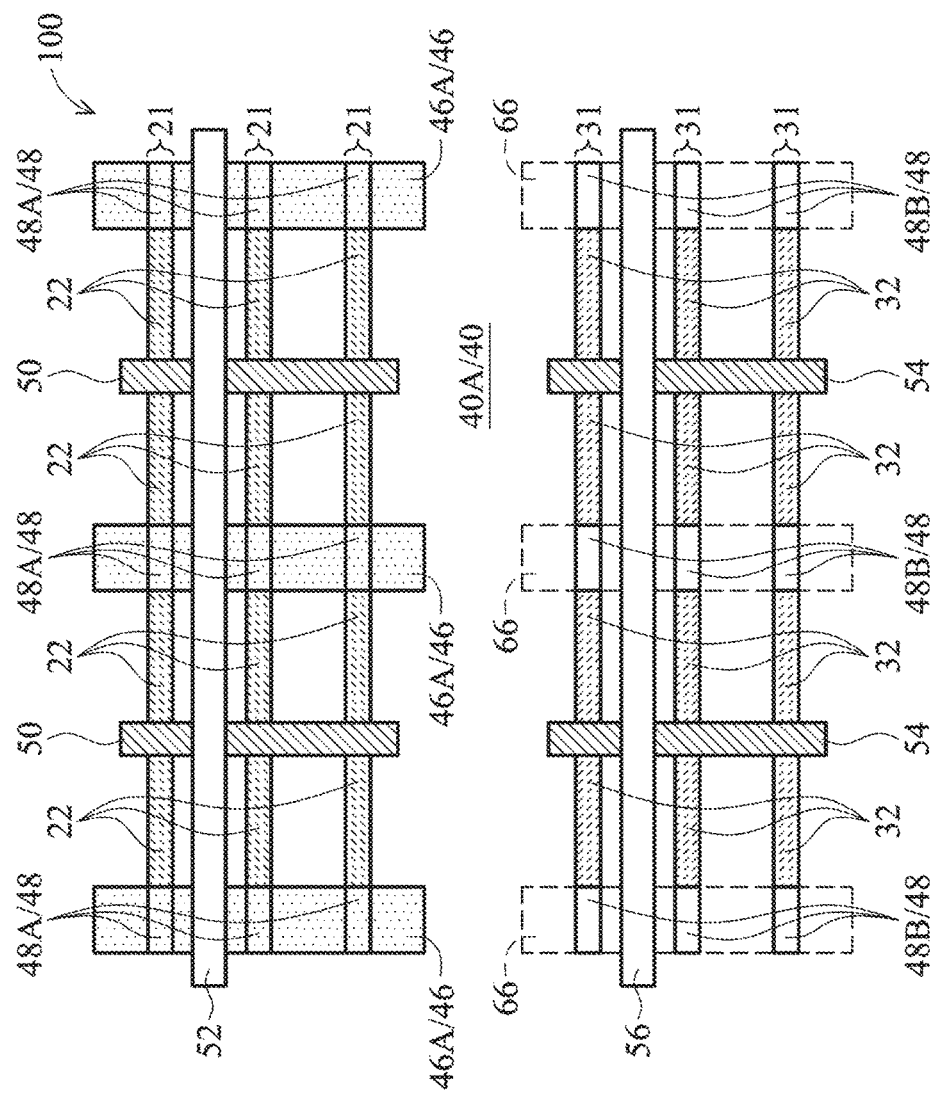
FIGS. 13 and 14 are top views of the STI diodes in accordance with alternative embodiments, wherein dummy gates and epitaxy block regions are mixed to define epitaxy regions.

FIG. 13 illustrates STI diode 100 in accordance with alternative embodiments. In these embodiments, dummy gate electrodes 46A are formed to cover some portions of fins 48A, and to assist the epitaxy growth of fins 22. Accordingly, dummy gate electrodes 46A define the locations where fins 22 are to be re-grown. The formation of dummy gate electrodes 46A is similar to the formation of dummy gate electrodes 46A shown in FIG. 2. The re-growth of fins 22 is similar to what is shown in FIG. 3. The locations of fins 32, on the other hand, are defined by epitaxy block regions 66, wherein no dummy gate electrode is formed to cover fins 48B. The formation of fins 32 is similar to what is shown in FIG. 11.

Figure 14:
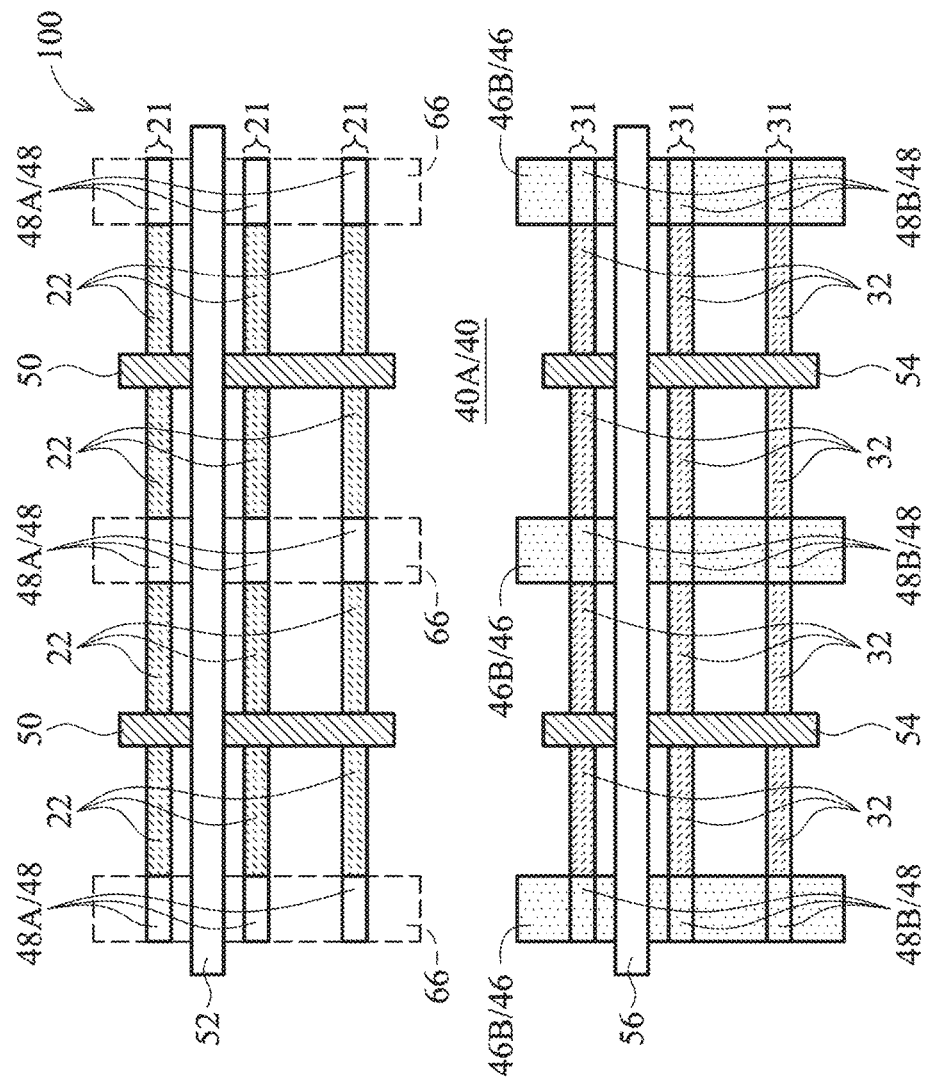

FIG. 14 illustrates STI diode 100 in accordance with yet alternative embodiments. These embodiments are similar to the embodiments in FIG. 13, except that dummy gate electrodes 46B are formed to cover some portions of fins 48B, and to assist the epitaxy growth of fins 32, while epitaxy block regions 66 are used to assist the epitaxy growth of fins 22, wherein no dummy gate electrode is formed to cover fins 48A.

Both the STI diodes 100 in FIGS. 13 and 14 include dummy gate electrodes 46, which may result in the reduction of pattern loading effect in the formation of gate electrodes in the same wafer. When used in ESD protection applications, p+ fins 32 may be connected to the electrical ground, and n+ fins may be connected to high voltages (while chip is under normal operation), which are also known as over-drive voltages higher than what the dummy gate dielectrics 60 (FIG. 6) are designed to sustain. Accordingly, the STI diode 100 in FIG. 14 may be used to work with applications having over-drive voltages. On the other hand, when no over-drive voltages are used, the STI diodes 100 shown in both FIGS. 13 and 14 may be used.

In each of the embodiments in FIGS. 1, 7, 8, 13, and 14, each of the combo fins forming the cathode and the anode of STI diode 100 includes a plurality of portions having different impurity concentrations and/or different conductivity types. For example, the combo fins 21 forming the cathode may include fins 22, which are n+ regions, and fins 48A, which are moderately doped p-type regions. Fins 22 and fins 48A are aligned to and in contact with each other to form combo fins 21. The combo fins 31 forming the anode may include fins 32, which are p+ regions, and fins 48B, which are moderately doped p-type regions. Fins 32 and fins 48B are aligned to and in contact with each other to form combo fins 31.

In the embodiments of the present disclosure, fin structures are adopted to form STI diodes, which may be used for ESD protection. The anode-to-cathode (or cathode-to-anode) current flowing through STI diodes 100 (FIGS. 1, 7, 8, 13, and 14) are perpendicular to the lengthwise directions of the fins, and hence the current-conducting ability of the STI diodes may be increased due to the increased widths of the current paths. Furthermore, since the dummy gate electrodes and the epitaxy block regions are perpendicular to the fins, the lengths of the dummy gate electrodes and the epitaxy block regions are likely to be reduced, and the chip area occupied by the dummy gate electrodes and the epitaxy block regions may be reduced, and hence the resulting STI diodes may occupy less chip area.

In accordance with some embodiments, a diode includes a first plurality of combo fins having lengthwise directions parallel to a first direction, wherein the first plurality of combo fins comprises portions of a first conductivity type. The diodes further includes a second plurality of combo fins having lengthwise directions parallel to the first direction, wherein the second plurality of combo fins comprises portions of a second conductivity type opposite the first conductivity type. An isolation region is located between the first plurality of combo fins and the second plurality of combo fins. A well region is underlying the isolation region, the first plurality of combo fins, and the second plurality of combo fins. The well region and the first plurality of combo fins form a first one of a cathode and an anode of the diode. The second plurality of combo fins forms a second one of the cathode and the anode. The diode is configured to have a current flowing in a second direction perpendicular to the first direction, with the current flowing between the anode and the cathode.

In accordance with other embodiments, a diode includes a p-well region, an STI region, a first semiconductor strip, and a first and a second semiconductor strip contacting opposite sidewalls of the STI region and parallel to each other. The first and the second semiconductor strips are portions of the p-well region. A first combo fin overlaps the first semiconductor strip, wherein the first combo fin includes a first portion heavily doped to p-type, and a second portion in physical contact with the first portion, wherein the second portion is moderately doped to p-type. A second combo fin overlaps the second semiconductor strip. The second combo fin includes a third portion heavily doped to n-type, and a fourth portion in physical contact with the third portion. The fourth portion is moderately doped to p-type. The first combo fin and the p-well region form an anode of the diode. The second combo fin forms a portion of a cathode of the diode.

In accordance with yet other embodiments, a method includes forming a first and a second semiconductor fin, wherein the first and the second semiconductor fins overlap a first and a second semiconductor strip, respectively. The first and the second semiconductor strips are parallel to each other, and contact opposite edges of an STI region. A well region of a first conductivity type is formed to extend under the STI region, into the first and the second semiconductor strips, and into the first and the second semiconductor fins. The second semiconductor fin and a first portion of the first semiconductor fin are covered. A second portion of the first semiconductor fin is etched. A semiconductor material is re-grown in a space left by the second portion of the first semiconductor fin to form a third portion for the first semiconductor fin. The third portion is heavily doped to the first conductivity type. The first semiconductor fin and a fourth portion of the second semiconductor fin are covered. A fifth portion of the second semiconductor fin is etched. An additional semiconductor material is re-grown in a space left by the fifth portion of the second semiconductor fin to form a sixth portion for the second semiconductor fin. The sixth portion is heavily doped to a second conductivity type opposite the first conductivity type. The first and the second semiconductor fins form a diode.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first semiconductor fin and a second semiconductor fin parallel to each other, wherein the first and the second semiconductor fins overlap a first semiconductor strip and a second semiconductor strip, respectively, and wherein the first and the second semiconductor strips are in contact with opposite edges of an isolation region;
    forming a well region of a first conductivity type, wherein the well region extends under the isolation region, into the first and the second semiconductor strips, and into the first and the second semiconductor fins;
    covering the second semiconductor fin and a first portion of the first semiconductor fin;
    etching a second portion of the first semiconductor fin;
    re-growing a first semiconductor material in a space left by the etched second portion of the first semiconductor fin to form a third portion for the first semiconductor fin, wherein the third portion is heavily doped to the first conductivity type;
    covering the first semiconductor fin and a fourth portion of the second semiconductor fin;
    etching a fifth portion of the second semiconductor fin; and
    re-growing a second semiconductor material in a space left by the etched fifth portion of the second semiconductor fin to form a sixth portion for the second semiconductor fin, wherein the sixth portion is heavily doped to a second conductivity type opposite to the first conductivity type, and wherein the first and the second semiconductor fins form a diode through the well region, the first semiconductor fin and the second semiconductor fin being different conductivity types, and wherein an entirety of the second semiconductor fin is a single conductivity type.

2. The method of claim 1, wherein the first and the second semiconductor fins are moderately doped with an impurity of the first conductivity type, the second semiconductor fin having an impurity concentration of between about 1014/cm3 and about 1018/cm3, and the first and the second semiconductor fins are overlying and electrically coupled to the well region.

3. The method of claim 1, wherein the well region forms one of a cathode and an anode with one of the first and the second semiconductor fins.

4. The method of claim 1, wherein the covering the second semiconductor fin and the first portion of the first semiconductor fin comprises:
    forming a dummy gate electrode covering the first portion of the first semiconductor fin; and forming a hard mask to cover the second semiconductor fin.

5. The method of claim 4 further comprising:
forming a contact plug to electrically connect to the third portion of the first semiconductor fin; and
forming an Inter-Layer Dielectric (ILD) to cover the first and the second semiconductor fins, wherein the dummy gate electrode remains to be electrically floating after the contact plug and the ILD are formed.

6. The method of claim 4 further comprising electrically grounding the dummy gate electrode.

7. The method of claim 1, wherein the covering the second semiconductor fin and the first portion of the first semiconductor fin comprises forming a hard mask to simultaneously cover an entirety of the second semiconductor fin and the first portion of the first semiconductor fin, and the method further comprises removing the hard mask after the first semiconductor material is regrown.

8. The method of claim 1, wherein the first portion of the first semiconductor fin is an end portion of the first semiconductor fin, and wherein when the first portion is covered, a middle portion of the first semiconductor fin is simultaneously covered.

9. The method of claim 1, wherein one of the third portion and the sixth portion forming a P-N junction with one of the first semiconductor strip and the second semiconductor strip, respectively.

10. A method comprising:
forming a Shallow Trench Isolation (STI) region extending into a p-well region, wherein a first semiconductor strip and a second semiconductor strip contacting opposite sidewalls of the STI region are parallel to each other, and the first and the second semiconductor strips are portions of the p-well region, and a first semiconductor fin and a second semiconductor fin are overlapping and contacting the first and the second semiconductor strips, respectively;
performing a first doping to heavily dope a first portion of the first semiconductor fin to p-type, wherein during the first doping, a second portion of the first semiconductor fin in physical contact with the first portion is covered; and
performing a second doping to heavily dope a third portion of the second semiconductor fin to n-type, wherein during the second doping, a fourth portion of the second semiconductor fin in physical contact with the third portion is covered, wherein the first semiconductor fin and the p-well region form an anode of a diode, and the second semiconductor fin forms a cathode of the diode, wherein after the performing the first doping and the performing the second doping, the first semiconductor fin is a single conductivity type, the first semiconductor fin comprising a first conductivity type and the second semiconductor fin consisting of a different conductivity type.

11. The method of claim 10 further comprising:
forming a first dummy gate electrode on sidewalls and a top surface of the second portion of the first semiconductor fin, with the first dummy gate electrode protecting the second portion from being doped in the first doping; and
forming a second dummy gate electrode on sidewalls and a top surface of the fourth portion of the second semiconductor fin, with the second dummy gate electrode protecting the fourth portion from being doped in the second doping.

12. The method of claim 10 further comprising:
forming a dummy gate electrode on sidewalls and a top surface of the second portion of the first semiconductor fin, wherein no dummy gate electrode is on sidewalls and a top surface of the fourth portion of the second semiconductor fin during the first doping, and a hard mask protects the fourth portion in the first doping.

13. The method of claim 10 further comprising:
forming a dummy gate electrode on sidewalls and a top surface of the fourth portion of the second semiconductor fin, wherein no dummy gate electrode is on sidewalls and a top surface of the second portion of the second semiconductor fin, and an additional hard mask protects the second portion in the second doping.

14. The method of claim 10, wherein no dummy gate electrode is on sidewalls and top surfaces of the second portion of the first semiconductor fin and the fourth portion of the second semiconductor fin when the first doping and the second doping are performed.

15. The method of claim 10, wherein the second portion and the fourth portion are end portions of the first semiconductor fin and the second semiconductor fin, respectively.

16. The method of claim 15, wherein a middle portion of the first semiconductor fin is covered when the first doping and the second doping are performed, and wherein opposite ends of the middle portion are connected to heavily doped p-type regions.

17. The method of claim 10 further comprising forming a contact plug to connect to the first portion of the first semiconductor fin.

18. A method comprising:
forming an isolation region extending into a p-well region, wherein a first semiconductor fin and a second semiconductor fin are spaced apart from each other by the isolation region, and are parallel to each other, and are of p-type;
forming a first mask to cover a first portion of the first semiconductor fin and an entirety of the second semiconductor fin, wherein a second portion of the first semiconductor fin is exposed through the first mask;
implanting the second portion of the first semiconductor fin to n-type, an interface between the second portion of the first semiconductor fin and the p-well region forming a p-n junction, the p-n junction being located below an upper surface of the isolation region, the upper surface being most distal from the p-well region;
removing the first mask;
forming a second mask to cover a third portion of the second semiconductor fin and an entirety of the first semiconductor fin, wherein a fourth portion of the second semiconductor fin is exposed through the second mask;
implanting the fourth portion of the second semiconductor fin with a p-type impurity;
removing the second mask;
forming a first contact plug to electrically connect to the second portion of the first semiconductor fin; and
forming a second contact plug to electrically connect to the fourth portion of the second semiconductor fin, wherein the second portion forms a cathode of a diode, and the fourth portion and the p-well region in combination form an anode of the diode.

19. The method of claim 18 further comprising, with the first mask covering the first portion, replacing the second portion with an epitaxy semiconductor region.

20. The method of claim 18 further comprising, with the second mask covering the third portion, replacing the fourth portion with an epitaxy semiconductor region.

21. The method of claim 18, wherein the one of the first mask and the second mask is formed with silicon nitride.

* * * * *